US009733532B2

(12) United States Patent
Okumoto

(10) Patent No.: US 9,733,532 B2
(45) Date of Patent: Aug. 15, 2017

(54) DISPLAY DEVICE AND METHOD OF MANUFACTURING THIN FILM TRANSISTOR

(71) Applicant: Mitsubishi Electric Corporation, Tokyo (JP)

(72) Inventor: Kazunori Okumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/713,618

(22) Filed: May 15, 2015

(65) Prior Publication Data

US 2015/0346565 A1    Dec. 3, 2015

(30) Foreign Application Priority Data

May 27, 2014  (JP) ................. 2014-108691

(51) Int. Cl.
*G02F 1/1343* (2006.01)
*G02F 1/1362* (2006.01)
*H01L 27/12* (2006.01)
*G02F 1/1345* (2006.01)

(52) U.S. Cl.
CPC .... *G02F 1/134363* (2013.01); *G02F 1/13452* (2013.01); *G02F 1/136227* (2013.01); *H01L 27/124* (2013.01); *H01L 27/1288* (2013.01); *G02F 2001/134372* (2013.01)

(58) Field of Classification Search
CPC .......... G02F 1/134363; G02F 1/13452; G02F 1/136227; H01L 27/1288; H01L 27/124
See application file for complete search history.

(56) References Cited

U.S. PATENT DOCUMENTS

| | | | | |
|---|---|---|---|---|
| 7,125,654 B2* | 10/2006 | Hirota | ............... | G02F 1/134363 430/319 |
| 7,932,976 B2* | 4/2011 | Naka | ................. | G02F 1/133555 349/114 |
| 8,836,877 B2* | 9/2014 | Choi | ................... | H01L 27/1225 257/59 |
| 2011/0210347 A1 | 9/2011 | Takeguchi | | |

FOREIGN PATENT DOCUMENTS

JP      2000-81638 A      3/2000
JP         4011557 B2    11/2007

\* cited by examiner

*Primary Examiner* — William Coleman
(74) *Attorney, Agent, or Firm* — Studebaker & Brackett PC

(57) ABSTRACT

The plurality of thin film transistors are provided corresponding to intersections between a plurality of gate wires and a plurality of source wires, respectively. The pixel electrodes are connected to the thin film transistors. The counter electrodes face the pixel electrodes. The leading line is provided outside a display area and connected to one of gate wires. The conversion portion is provided in the vicinity of the display area, at which the leading line is connected to another wiring layer. The insulating film is provided on the conversion portion at a side of the counter substrate. The conductive layer faces the conversion portion with the insulating film interposed therebetween and has transparency. To the conductive layer together with the counter electrodes, applied is a common potential.

11 Claims, 12 Drawing Sheets

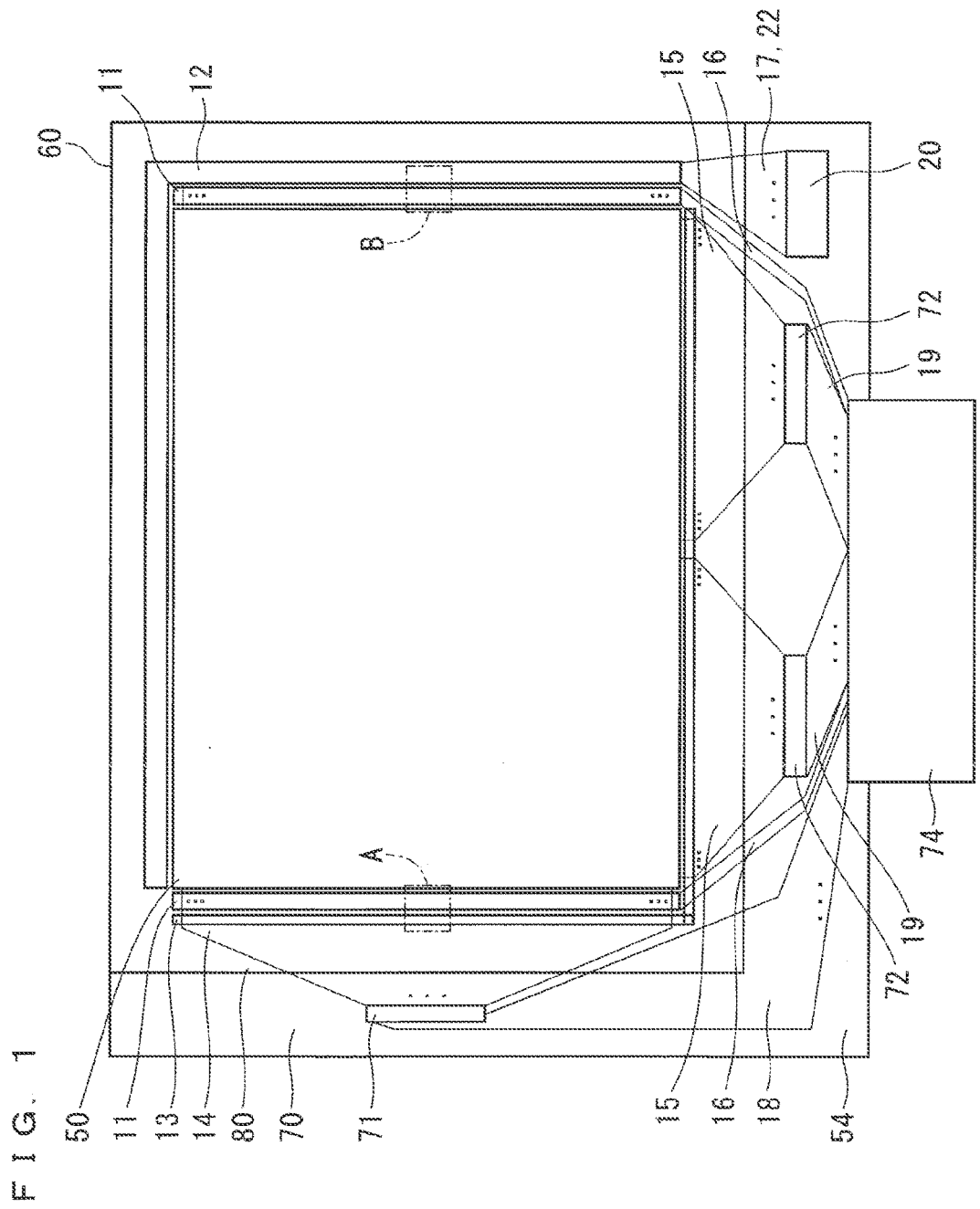

F I G. 1 5
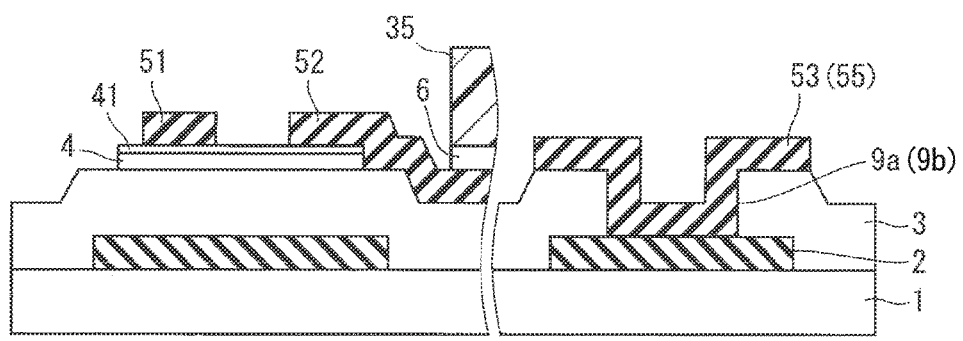
F I G. 1 6
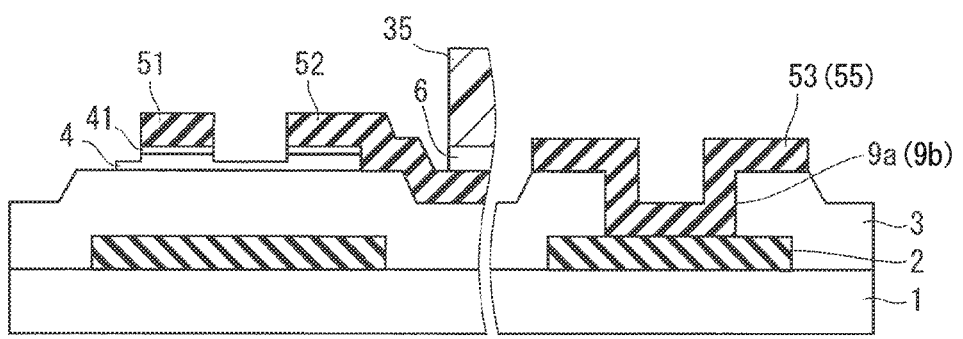

DISPLAY DEVICE AND METHOD OF MANUFACTURING THIN FILM TRANSISTOR

BACKGROUND OF THE INVENTION

Field of the Invention

The present invention relates to a technique relevant to a display device, and the technique is applied to, for example, a transverse electric field type liquid crystal display.

Description of the Background Art

In recent years, widely used have been new-type display devices having thin planar-shaped display panels utilizing principles such as liquid crystal, electroluminescence (EL), charged corpuscle, and the like, instead of conventional Braun tubes. A liquid crystal display, which is typical of these new-type display devices, has characteristics such as not only thin and light but also allowing low-voltage driving with low power consumption.

In a liquid crystal display, liquid crystal is sealed between two substrates. One of the substrates is an array substrate having a display area in which a plurality of pixels are arranged in matrix and the other substrate is a counter substrate on which a color filter, a black matrix (light shielding film), and the like are formed. The array substrate and the counter substrate are attached to each other with a sealing material.

Among various types of liquid crystal displays, in a thin film transistor (hereinafter, referred to also as "TFT") liquid crystal display, a TFT serving as a switching element is provided in each pixel on the array substrate. Since each pixel can thereby independently hold a voltage for driving the liquid crystal, it is possible to achieve a high-quality display with less crosstalk.

Further, in each pixel, provided are a gate wire (scanning wire) which controls on/off of the TFT and a source wire (signal wire) for inputting image data, which crosses the gate wire. Usually, an area enclosed by the gate wire and the source wire corresponds to each pixel.

In-plane switching type of a transverse electric field type liquid crystal display performs a display by applying a substantial transverse electric field to a substrate surface. More specifically, a plurality of pixel electrodes and a plurality of counter electrodes (common electrodes) are arranged on the array substrate. In an early-stage in-plane switching type, especially, the pixel electrodes and the counter electrodes are formed in the same layer or different layers in a slit shape or a comb-teeth shape and arranged alternately with gaps in a plan view.

Compared with a conventional TN (Twisted Nematic) type, the in-plane switching type has an advantage of excellent viewing angle characteristics. In the early-stage in-plane switching type where the pixel electrodes and the counter electrodes are arranged alternately with gaps in a plan view, however, electrode portions of the pixel electrodes and the counter electrodes hardly contribute to the display. Therefore, compared with the TN type, the early-stage in-plane switching type has a disadvantage of low light transmittance.

As a transverse electric field type in which this flaw is improved, there is a fringe field switching (hereinafter, referred to also as "FFS") type. The FFS type is the in-plane switching type in a broad sense and sometimes called the transverse electric field type or the in-plane switching type, not distinguished from the transverse electric field type in which the pixel electrodes and the counter electrodes are arranged alternately with gaps in a plan view.

Also in a FFS liquid crystal display, the pixel electrodes and the counter electrodes are formed on the array substrate (one-side substrate) like in the early-stage in-plane switching type. However, the pixel electrodes and the counter electrodes are arranged vertically in a stacked manner with insulating films interposed therebetween. Further, usually, a lower electrode (either one of the pixel electrode and the counter electrode) has a plate-like (planar) shape and an upper electrode (the other one of the pixel electrode and the counter electrode) has a slit shape having openings or a comb-teeth shape.

In the FFS type, the liquid crystal is driven by a fringe electric field between the upper electrode and the lower electrode. Therefore, the liquid crystal which exists above the electrode portion of the upper electrode (opposite to the lower electrode) is also driven to contribute to the display. The FFS type thereby has an advantage of increased light transmittance, as compared with the IPS type other than the FFS type.

On the other hand, in the transverse electric field type such as the in-plane switching type or the FFS type, a surface of the counter substrate on the side of the liquid crystal is constituted of insulating films such as a black matrix, an overcoat, a color filter, and the like formed of organic resins. In other words, there is no transparent conductive film serving as the counter electrode (common electrode), unlike in the TN type. For this reason, in the transverse electric field type, an electric field generated from a gate-wire leading line on the array substrate produces some effect on the counter substrate.

Specifically, the above-described effect, for example, invites a problem that the counter substrate causes potential variation and this causes display unevenness around a display area in the vicinity of the gate-wire leading line.

Then, as a countermeasure thereagainst, Japanese Patent Publication No. 4011557 proposes that a shield electrode (conductive film) should be arranged on the gate-wire leading line on the array substrate with an insulating film interposed therebetween and then this shields the above-described electric field, to thereby solve the display unevenness.

Japanese Patent Application Laid Open Gazette No. 2000-81638 is also a prior art document relevant to the present invention. Japanese Patent Application Laid Open Gazette No. 2000-81638 discloses a technique in which wires arranged on different layers are connected to each other with a wire arranged on a still upper layer.

The liquid crystal display, generally, is provided with a collectively-driving lighting testing circuit used for inspection therefor or a protection circuit which is popularly called a short ring in some cases. It is not desirable that the above-described countermeasure with the structure disclosed in Japanese Patent Publication No. 4011557 is performed at a portion connecting a wiring layer used for these circuits and the gate wire, since a so-called frame area other than a display portion in which the pixels are collectively formed is widened.

More specifically, in the structure shown Japanese Patent Publication No. 4011557, a transparent electrode covers the gate wire from the upper side with a protection film interposed therebetween but a gate terminal provided in the same layer as the transparent electrode is connected to the gate wire through a contact hole. Therefore, in order to electrically insulate the gate terminal (connected to the gate wire) and the transparent electrode from each other, these elements occupy another area also in a plan view. The extension of such an occupied area invites extension of the above-described frame area and this further prevents improvement in high definition.

Conversely, if the above-described countermeasure cannot be performed, the above-described portion has high density and the area thereof is widened. Around the display area in the vicinity of the portion, there arises display unevenness. This display unevenness becomes remarkable in a display device having high definition.

SUMMARY OF THE INVENTION

It is an object of the present invention to provide a technique to suppress display unevenness and also suppress decrease in display quality without widening a frame area in a transverse electric field type liquid crystal display.

A display device includes an array substrate and a counter substrate. The counter substrate faces the array substrate. The array substrate has a plurality of thin film transistors, pixel electrodes, counter electrodes, a leading line, a conversion portion, an insulating film, and a conductive layer. The plurality of thin film transistors are provided corresponding to intersections between a plurality of gate wires and a plurality of source wires, respectively. The pixel electrodes are connected to the thin film transistors. The counter electrodes face the pixel electrodes. The leading line is provided outside a display area and connected to one of the gate wires. The conversion portion is provided in the vicinity of the display area, at which the leading line is connected to another wiring layer. The insulating film is provided on the conversion portion at a side of the counter substrate. The conductive layer faces the conversion portion with the insulating film interposed therebetween and has transparency. To the conductive layer together with the counter electrodes, applied is a common potential.

It is thereby possible to suppress display unevenness and also suppress decrease in display quality without widening a frame area.

A method of manufacturing a thin film transistor is a method for forming an electrode and a conductive film on a structure. The structure has a gate wire, a gate insulating film, and a semiconductor film The gate insulating film is provided on the gate wire. The semiconductor film is provided on the gate insulating film. The electrode forms a thin film transistor together with the structure. The conductive film is connected to the gate wire. An etching mask is used for forming the semiconductor film to be used to obtain the thin film transistor and for selectively removing the gate insulating film and the semiconductor film to be used to connect the conductive film to the gate wire. The etching mask is obtained by using a photomask used in one photolithography process.

It is thereby possible to share the process steps of exposure, development, and removal of a photoresist, and therefore a process time is reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view schematically showing a structure of a FFS type liquid crystal display in accordance with a first embodiment;

FIGS. 9 to 16 are cross sections used for explanation of a flow of manufacturing process of a display device in accordance with a second embodiment.

DESCRIPTION OF THE PREFERRED EMBODIMENTS

<The First Embodiment>

Figure 2:
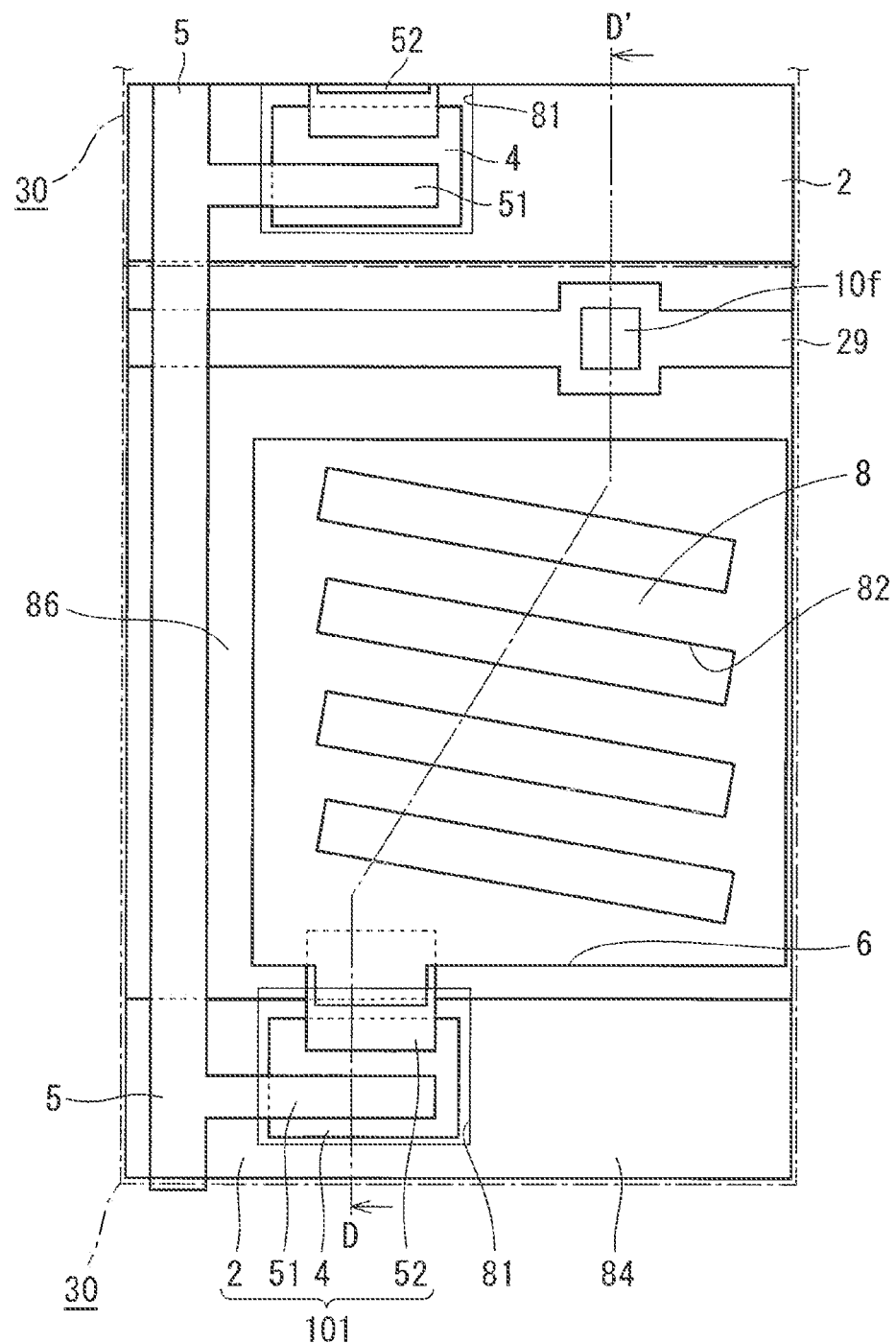
FIG. 2 is a plan view as viewed from a side of a counter substrate, enlargedly showing a pixel on an array substrate.

FIG. 1 is a plan view schematically showing a structure of a FFS liquid crystal display in accordance with the first embodiment.

The liquid crystal display has a liquid crystal display panel 60. The liquid crystal display panel 60 comprises an array substrate 70 and a counter substrate 80 facing the array substrate 70 in a plan-view direction.

The array substrate 70 is divided into a display area 50 and a frame area 54 on an outer side of the display area 50 in a plan view.

The array substrate 70 and the counter substrate 80 are attached to each other with a sealing material (not shown), to constitute the liquid crystal display panel 60. More specifically, the array substrate 70 and the counter substrate 80 each have an orientation film, and these orientation films are stacked on each other in a facing manner. These substrates are provided with a gap of about several μm formed by a spacer material formed of an organic resin or the like and attached to each other with the sealing material which is so formed as to surround the display area 50. In the gap inside this sealing material, sealed is liquid crystal.

More specifically, in a fabrication process of the liquid crystal display panel 60, the array substrate 70 and the counter substrate 80 are each coated with the orientation film formed of an organic resin such as polyimide or the like. After that, an orientation process is performed so that molecules of liquid crystal should be oriented to a predetermined direction, by using a method such as rubbing, photo-alignment, or the like.

In the display area 50, a plurality of pixels are arranged in matrix. In FIG. 1, however, the pixels are not shown, for avoiding complication of illustration.

In the frame area 54, a gate-wire driving circuit 71, a source-wire driving circuit 72, and a flexible substrate 74 are mounted on a plurality of connection terminals (not shown) by using the COG (Chip On Glass) mounting technology.

The gate-wire driving circuit 71 receives a signal for driving a gate wire from a gate IC input wire connected to the flexible substrate 74, and then converts the signal into a gate potential and gives the gate potential to a gate-wire leading line 14.

The source-wire driving circuit 72 receives a signal for driving a source wire from a source IC input wire connected to the flexible substrate 74, and then converts the signal into a source potential and gives the source potential to a source-wire leading line 15.

The flexible substrate 74 is connected to an external circuit. The external circuit supplies the gate-wire driving circuit 71 and the source-wire driving circuit 72 with a control signal, a clock, image data, a driving voltage, and the like.

The frame area 54 is also provided with a collectively-driving lighting inspection terminal 20. The collectively-driving lighting inspection terminal 20 is connected to a collectively-driving lighting testing circuit leading line 17.

The frame area 54 is still also provided with a common wire 11, a collectively-driving lighting testing circuit 12, and a short ring 13 serving as a protection circuit. These constituent elements will be described later.

The counter substrate 80 faces the array substrate 70 with the liquid crystal (not shown) interposed therebetween. In the counter substrate 80, a black matrix formed of black organic resin, an overcoat formed of transparent organic resin, a color filter, an orientation film, and the like (all of which are not shown) are formed on an insulating substrate such as glass, plastic or the like.

It can be grasped that the color filter, the black matrix, the liquid crystal, and the sealing material all of which are not shown are also constituent elements of the liquid crystal display panel 60.

On both surfaces of the liquid crystal display panel 60 which is formed thus, attached are a polarizing plate and a phase plate.

An external circuit for supplying various electrical signals is attached to the liquid crystal display panel 60, and/or a back light unit is attached to a rear surface of the liquid crystal display panel 60 in a transmission type, and the liquid crystal display panel 60 is accommodated into an enclosure, to thereby obtain a liquid crystal display.

Further, in a case where the liquid crystal display panel 60 is a small-sized one, a driving circuit in which the gate-wire driving circuit 71 and the source-wire driving circuit 72 are integrated is used in many cases, in order to save space of the frame area 54.

In the transverse electric field type liquid crystal display, usually, the counter electrode (common electrode) formed of a transparent oxide conductive film such as ITO (indium Tin Oxide) or the like is not formed on the side of the liquid crystal of the counter substrate 80. In this case, on the side of the liquid crystal, an insulating film serving as a dielectric is provided but any conductor is not provided. Therefore, if no shield electrode for shielding the electric field caused by the gate potential of the array substrate 70 is provided, potential variation is caused by the electric field in the insulating substrate, the black matrix, the overcoat, the color filter, and the like on the counter substrate 80. This causes display unevenness around the display area 50 in the vicinity of an area where the electric field occurs.

Figure 3:
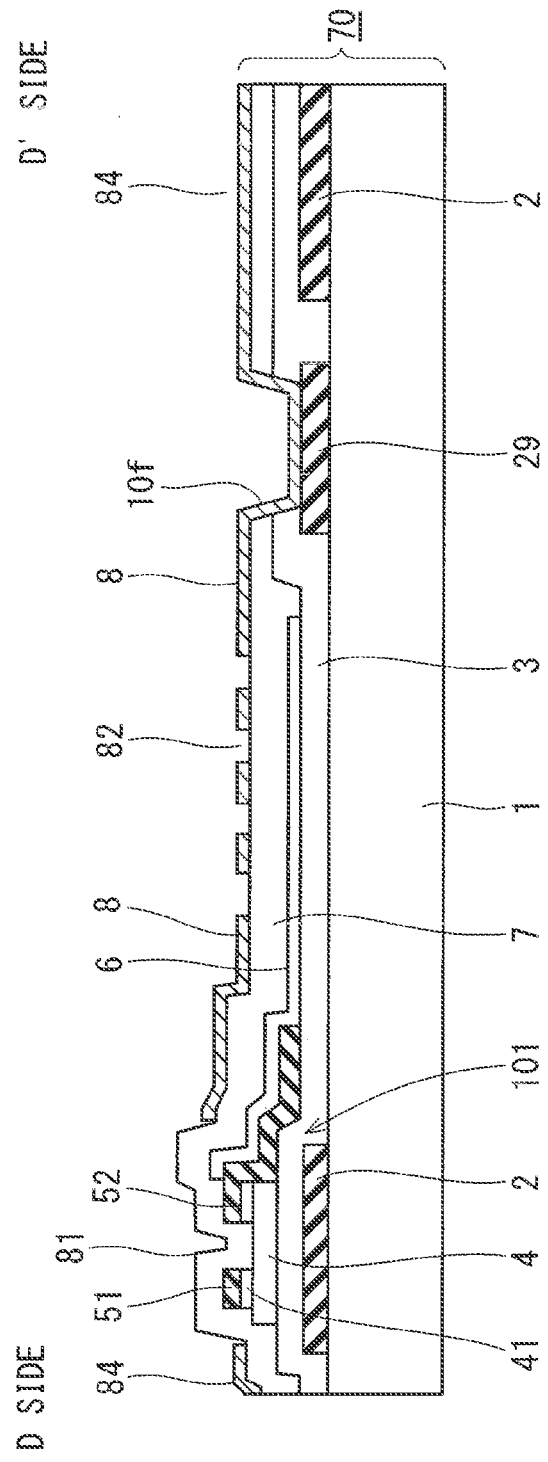
FIG. 3 is a cross section taken along the line D-D' of FIG. 2.

Hereinafter, a structure for shielding the electric field will be described. FIG. 2 is a plan view as viewed from the side of the counter substrate 80, enlargedly showing a pixel 30 on the array substrate 70. In FIG. 2, however, a gate insulating film 3 and a protection film 7 are not shown. FIG. 3 is a cross section taken along the line D-D' of FIG. 2.

The array substrate 70 has various constituent elements which are formed on or above (the side closer to the counter substrate 80) the insulating substrate 1 made by glass, plastic, or the like. The above-described flexible substrate 74 is also provided on the insulating substrate 1.

A plurality of gate wires 2 are formed on the insulating substrate 1 extending in the left and right (horizontal) direction of FIG. 2 and a plurality of source wires 5 are formed above the gate wires 2 extending in an up-and-down (vertical) direction of FIG. 2. In the display area 50, the above-described TFTs (thin film transistors) 101 are provided corresponding to intersections between the plurality of gate wires 2 and the plurality of source wires 5. Therefore, the pixels 30 are arranged in matrix in the display area 50, Usually, either one color of the color filters of the three primary colors of red, blue, and green corresponds to each of the pixels 30. In order to improve color reproducibility, the color filters of four primary colors or more are used in some cases.

The insulating substrate 1 and the gate wire 2 are covered with the gate insulating film 3. The gate insulating film 3 is formed of an inorganic film such as an oxide film, a nitride film, or the like. Further, on the gate insulating film 3 on a partial area of the gate wire 2, a semiconductor film 4 and an ohmic contact film 41 obtained by implanting impurity into the semiconductor film 4 are layered in an island manner.

The source wires 5 are so provided on the gate insulating film 3 as to cross the gate wires 2. Some of the source wires 5 are also provided on the ohmic contact film 41.

The gate wires 2 and the source wires 5 are formed of: a metal such as Al, Cr, Mo, Ti, Ta, W, Ni, Cu, Au, Ag, or the like; or an alloy or a laminated film thereof.

The gate-wire leading line 14 (see FIG. 1) is formed in the same process as that of the gate wire 2, the common wire 11 and the source-wire leading line 15 (both see FIG. 1) are formed in the same process as that of the source wire 5. Therefore, the gate-wire leading line 14 is provided on the insulating substrate 1, and the common wire 11 and the source-wire leading line 15 are provided on the gate insulating film 3.

In the pixel 30, a pixel electrode 6 is provided as a lower electrode (the farther one from the counter substrate 80) and a counter electrode 8 is provided as an upper electrode (the closer one to the counter substrate 80). The pixel electrode 6 and the counter electrode 8 are formed, facing each other in a plan-view direction. Since the counter electrode 8 covers the pixels 30 almost entirely, in FIG. 2, only openings 81 and 82 of the counter electrode 8 are indicated by fine lines as a contour of the shape of the counter electrode 8. Constituent elements provided below the counter electrode 8 (on the farther side from the counter substrate 80) in a plan view are hidden by the counter electrode 8. In FIG. 2, however, for avoiding complication of illustration, contours of the constituent elements hidden by the counter electrode 8 are indicated by solid lines, not by broken lines (usually adopted in a plan view).

However, broken lines are also used to indicate the vertical position relation (distance relation from the counter electrode 8) other than the above. In other words, when the contour of one constituent element overlaps another constituent element in a plan view, if the contour of the one constituent element is closer to the counter electrode 8 than another constituent element, the contour of the one constituent element is indicated by a solid line. On the other hand, if the contour of the one constituent element is farther from the counter electrode 8, the contour of the one constituent element is indicated by a broken line.

In the pixel 30, a source electrode 51, a drain electrode 52, the semiconductor film 4, and the part of the gate wire 2 located just below the semiconductor film 4 constitute a TFT 101 serving as a switching element. The source electrode 51 projects from the source wire 5 in a plan view. The drain electrode 52, which is partially covered with part of the pixel electrode 6, is in contact with and electrically connected to the pixel electrode 6. Alternatively, part of the pixel electrode 6 may be formed at a layer level lower than the drain electrode 52, which allows electronic contact of the pixel electrode 6 and the drain electrode 52.

The source electrode 51 and the drain electrode 52 are provided, overlapping the ohmic contact film 41 in a plan view, to be thereby connected to the semiconductor film 4 through the ohmic contact film 41.

Specifically, after the ohmic contact film 41 is formed on the semiconductor film 4 without being shaped, the source electrode 51 and the drain electrode 52 are formed on the ohmic contact film 41. Then, the ohmic contact film 41 exposed from the source electrode 51 and the drain electrode 52 is removed. By removing the ohmic contact film 41 between the source electrode 51 and the drain electrode 52, the semiconductor film 4 serves as a channel portion of the TFT 101. The gate wire 2 provided below the channel portion serves as a gate electrode.

In some cases, the semiconductor film 4 and the ohmic contact film 41 are not only formed in an area where these elements are formed as the TFT 101 but also formed, extending along the source wire 5, to be located in a layer below the source wire 5. Further, in other cases, the semiconductor film 4 and the ohmic contact film 41 are arranged at the intersections between the gate wires 2 and the source wires 5 in an island manner, in order to suppress break of the source wires 5.

The pixel electrode 6 has a plate-like shape, and in a case where the liquid crystal display panel 60 is a transmission type, the pixel electrode 6 is formed of a transparent oxide conductive film such as ITO or the like. In a case where the liquid crystal display panel 60 is a reflection type, the pixel electrode 6 has a surface formed of a conductive film of high reflectance and is formed of: a metal such as Al, Ag, Pt, or the like; or an alloy or a laminated film thereof in some cases.

The protection film 7 (now shown in FIG. 2) is provided in a layer above the source wires 5, the TFT 101, the pixel electrode 6, and the like, to cover these constituent elements. The protection film 7 is formed of an inorganic film such as an oxide film, a nitride film, or the like, an insulating film of organic resin, or a laminated film of these films.

Alternatively, though not shown, there may be a structure where the protection film formed of an inorganic film such as an oxide film, a nitride film, or the like, an insulating film of organic resin, or a laminated film of these films is formed above the source wires 5, the TFT 101, and the like to cover them, then the pixel electrode 6 is formed thereabove, and another insulating film is formed. In this case, the pixel electrode 6 is connected to the drain electrode 52 though a contact hole which opens the protection film 7.

Also in such a structure, like in the structure of FIG. 3, the pixel electrode 6 is connected to the TFT 101 (more specifically, the drain electrode 52 included therein).

The counter electrode 8 is formed of a transparent oxide conductive film such as ITO or the like, and provided on the protection film 7. In terms of suppressing the short circuit between the source wires 5 and counter electrode 8 due to an extraneous matter or the like, it is preferable to laminate or thicken one or more interlayer insulating films (for example, the protection film 7 in conformity with FIG. 3) provided between the source wires 5 and the counter electrode 8.

FIG. 2 shows an exemplary case where the counter electrode 8 has a slit shape (hole shape) having an opening 82. The counter electrode 8, however, may have a comb-teeth shape (a shape in which one side of the opening 82 is an open end) or a stripe shape.

The counter electrode 8 is connected to a wire 29 through a contact hole 10f. The wire 29 can be formed in the same process as that of the gate wire 2. The counter electrode 8 is supplied with a common potential through the wire 29 and causes a fringe electric field between itself and the pixel electrode 6 through the protection film 7 in an area of the opening 82. The fringe electric field drives the liquid crystal.

The plurality of pixels 30, for example, are provided adjacently in both longitudinal and transverse directions in a plan view of FIG. 2. In the pixels 30 provided adjacently in the longitudinal direction, the counter electrodes 8 therein are connected to each other with a connection portion 84, and in the pixels 30 provided adjacently in the transverse direction, the counter electrodes 8 therein are connected to each other with a connection portion 86. The connection portions 84 and 86 are formed in the same process as that of the counter electrode 8, both are formed on the protection film 7 in conformity with the exemplary case of FIG. 3.

Since it is grasped that the connection portions 84 and 86 are portions except the counter electrode 8 facing the pixel electrode 6, it can be grasped that these connection portions have a lattice (mesh) shape covering the substantial entire of the gate wires 2 and the source wires 5. The connection portions 84 and 86 serve to reduce the resistance of the counter electrode 8 and shield the electric field from the gate wires 2 and the source wires 5 to the liquid crystal.

Usually, a black matrix is provided on the counter substrate 80 along the gate wires 2 or the source wires 5 in the display area 50. Since the connection portions 84 and 86 shield the electric field as mentioned above, however, in a normally black mode of the transverse electric field type, the connection portions 84 and 86 serve as a light shielding film. Therefore, the black matrix can be omitted.

As a matter of course, only either one of the connection portions 84 and 86 may be provided.

Further, in FIGS. 2 and 3, openings 81 are provided on the counter electrode 8 and the connection portions 84 and 86 above the TFT 101 in order to prevent the common potential supplied to the counter electrode 8 from producing any effect on the property of the TFT 101.

The opening 81, however, may be a cause of electric field leakage from the gate wire 2 to the liquid crystal. Therefore, the opening 81 should be made as small as possible, or a structure in which no opening 81 is provided above the TFT 101 may he adopted.

The gate-wire leading line 14 is coupled with the gate wire 2 (crossing the not-shown sealing material) and extends toward the output of the gate-wire driving circuit 71 and is connected thereto, The source-wire leading line 15 is coupled with the source wire 5 (crossing the sealing material) and extends toward the output of the source-wire driving circuit 72 and is connected thereto. Therefore, the gate-wire leading lines 14 and the source-wire leading lines 15 are provided in the number corresponding to the number of rows and the number of columns of the pixels 30 arranged in the display area 50, respectively. In FIG. 1, however, for avoiding complication of illustration, only some of the gate-wire leading lines 14 and the source-wire leading lines 15 are shown. The same applies to common-wire leading lines 16 and collectively-driving lighting testing circuit leading lines 17 described later.

Though not shown in detail, a connection terminal which is COG-connected to an output terminal of the gate-wire driving circuit 71 is formed on the array substrate 70. The connection terminal is formed in the same process as that of the counter electrode 8 and the connection portions 84 and 86. The gate-wire leading line 14 is formed in the same process as that of the gate wire 2, and is covered with the gate insulating film 3 and the protection film 7, like the gate wire in FIG. 3, and the connection terminal is provided on the protection film 7. Therefore, the gate-wire leading line 14 and the connection terminal are connected to each other through a contact hole provided in the gate insulating film 3 and the protection film 7.

Figure 4:
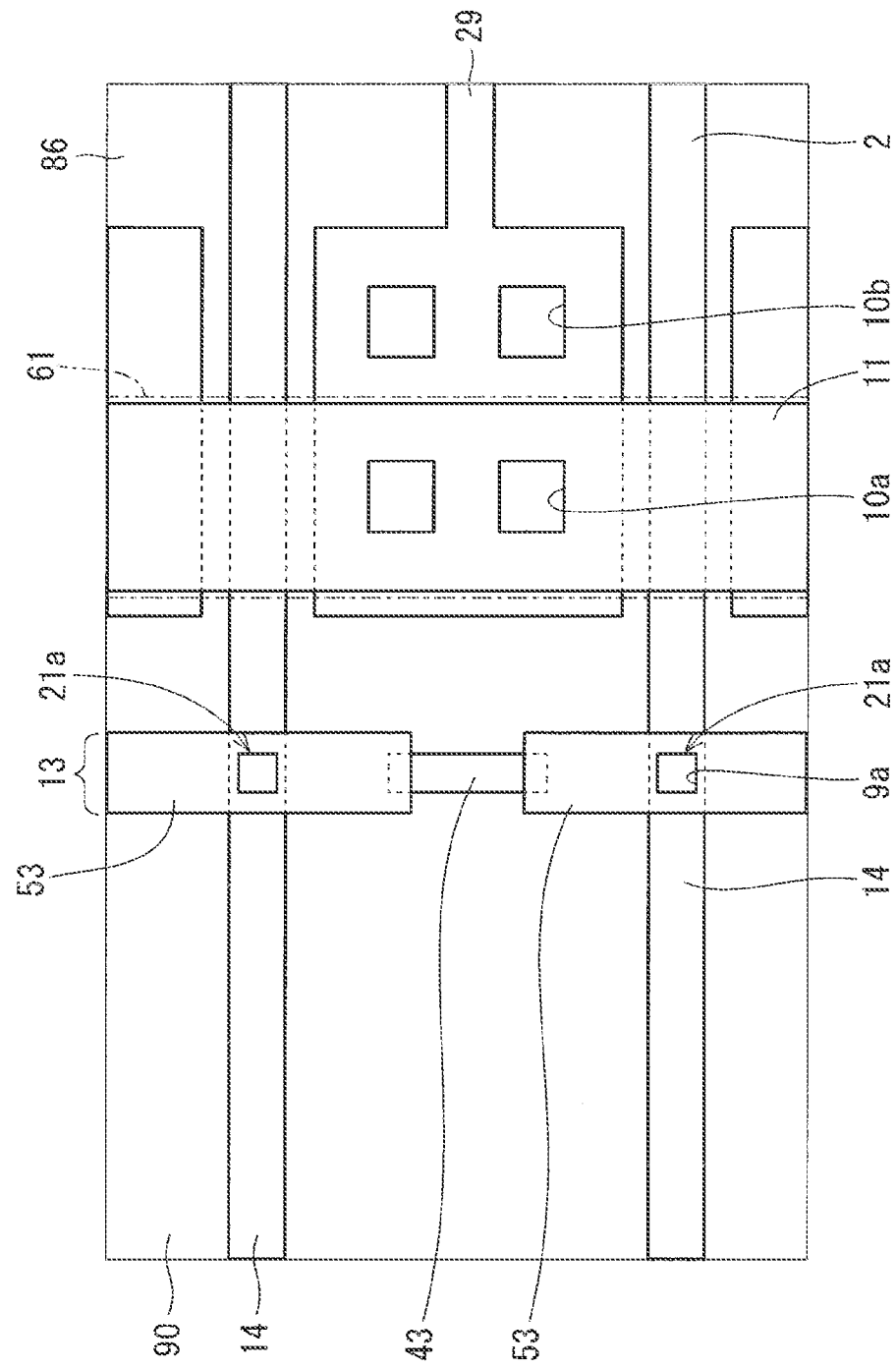
FIG. 4 is a plan view enlargedly showing an area A of FIG. 1.
Figure 5:
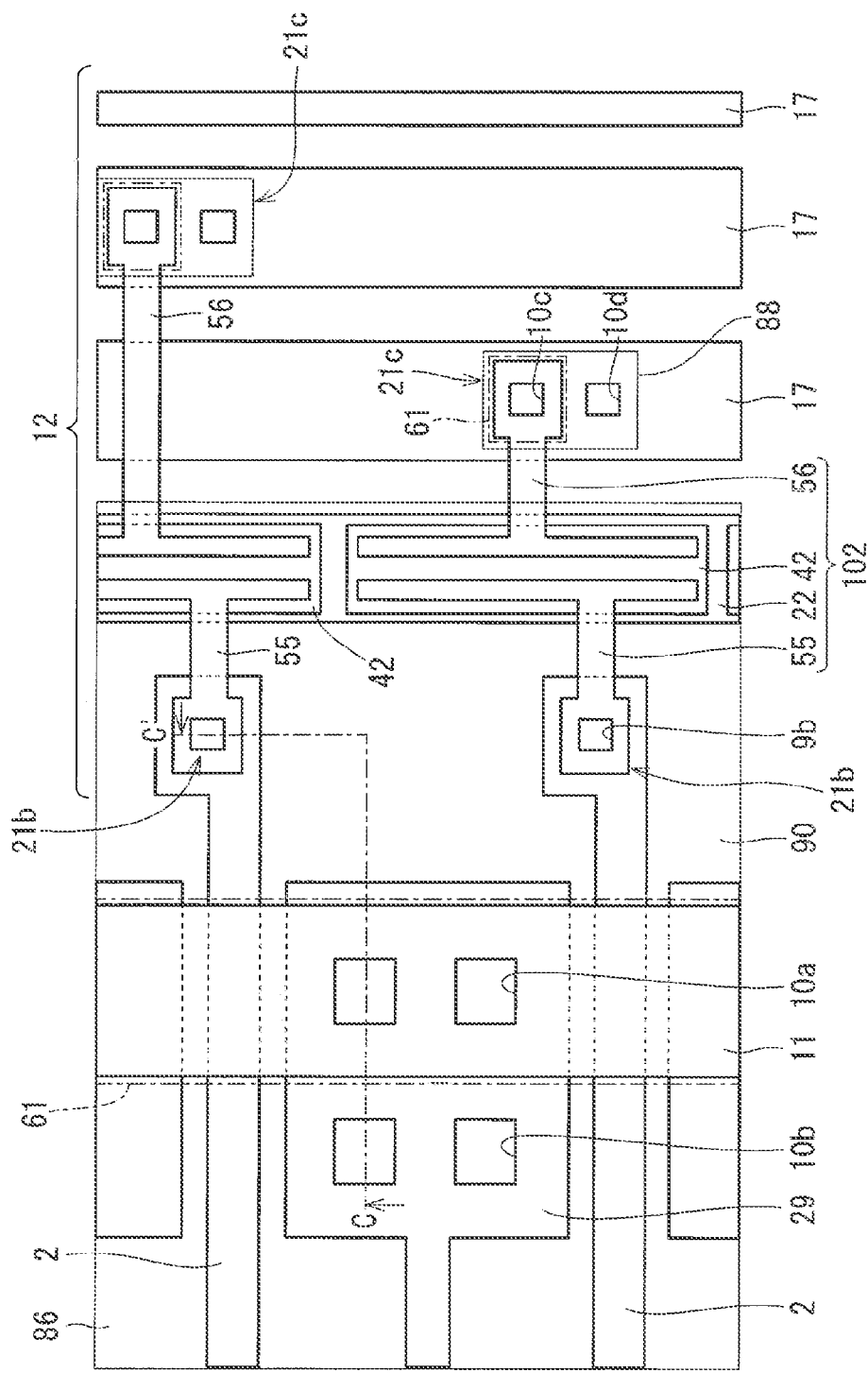
FIG. 5 is a plan view enlargedly showing an area B of FIG. 1.

FIG. 4 is a plan view enlargedly showing the area A of FIG. 1, and FIG. 5 is a plan view enlargedly showing the area B of FIG. 1. In conformity with the areas A and B of FIG. 1, exactly, part of the display area 50 appears on the right side of the paper of FIG. 4 and the left side of the paper of FIG. 5. In FIG. 1, however, for clearly showing the areas A and B, the areas A and B are illustrated in ranges wider (including the display area 50) than those shown in FIGS. 4 and 5. The hidden line and the fine line mean the same contents as those shown in FIG. 2. A contour of a film 61 formed in the same process as that of the pixel electrode 6 is indicated by a dash-dotted line. Then, a contour of a constituent element covered with the film 61 (closer to the insulating substrate 1 than the film 61) is not indicated by a broken line (the same applies to other figures). Like in FIG. 2, the gate insulating film 3 and the protection film 7 are not shown.

Figure 6:
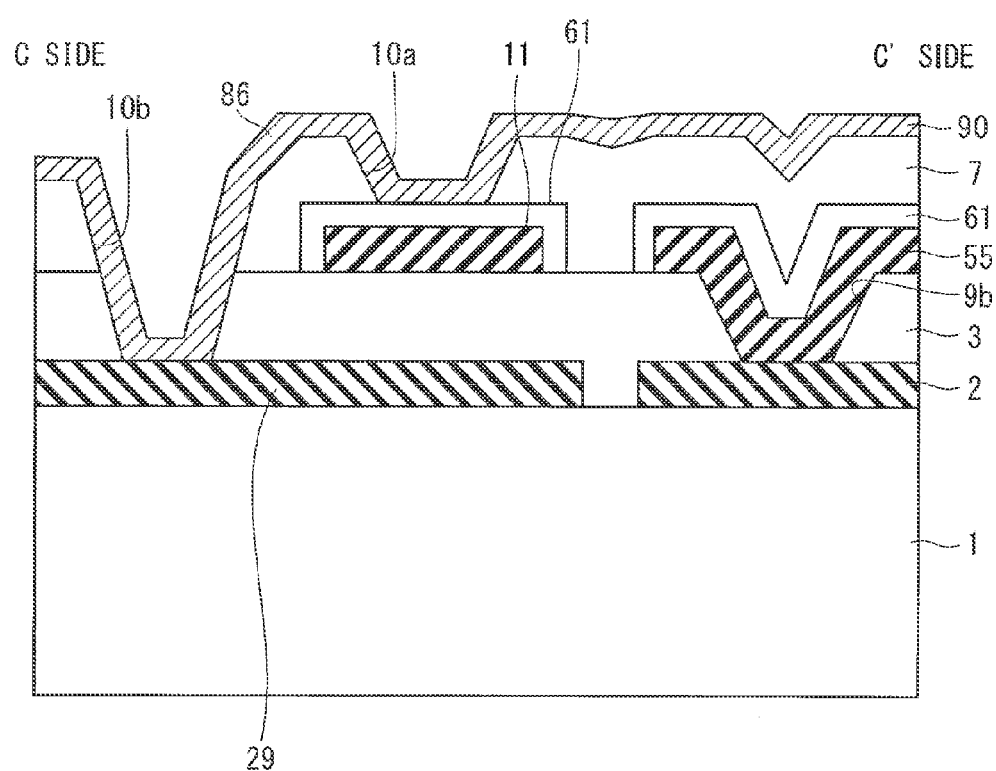
FIG. 6 is a cross section taken along the line C-C' of FIG. 5.

FIG. 6 is a cross section taken along the line C-C' of FIG. 5. Since the counter electrode 8 is farther from the insulating substrate 1 than the gate wire 2 and the source wire 5, the contour thereof is indicated by a fine line in FIG. 5. Since the gate wire 2 is closer to the insulating substrate 1 than the source wire 5, if the contour of the gate wire 2 overlaps the source wire 5 in a plan view, the contour is indicated by a broken line serving as a hidden line in FIG. 5.

In FIG. 4, the short ring 13 is arranged on the left side of the paper with respect to the common wire 11 (in other words, on the side farther from the display area 50 and closer to the gate-wire driving circuit 71 than the common wire 11).

The short ring 13 has a wire 53 serving as a conductive film and a semiconductor film 43. The wire 53 can be formed in the same process as that of the source wire 5, and the semiconductor film 43 can be formed in the same process as that of the semiconductor film 4.

The wire 53 is connected to the semiconductor film 43 through an ohmic contact film (not shown), like the drain electrode 52 and the semiconductor film 4 are connected to each other in FIG. 3.

The wire 53 and the gate wire 2 (also can be grasped as the gate-wire leading line 14 in the vicinity of this area) are connected to each other through a contact hole 9a at a conversion portion 21a. The contact hole 9a penetrates the gate insulating film 3 (see FIG. 3 or 6) in part of an area where the gate wire 2 and the wire 53 overlap each other in a plan view.

Though not shown, in a plurality of TFTs, the wires 53 may be connected to each other with a diode or a shift register may be arranged.

The common wire 11 can be formed in the same process as that of the source wire 5. Therefore, the common wire 11 and the connection portion 86 sandwich the protection film 7 (the common wire 11 is provided in an area where no pixel electrode 6 is provided). Further, the common wire 11 and the wire 29 which is formed in the same process as that of the gate wire 2 sandwich the gate insulating film 3. The common-wire leading line 16 can be formed in the same process as that of the gate wire 2 and is connected to the common wire 11 through a connection portion in a not-shown position.

In part of an area where the common wire 11 and the connection portion 86 overlap each other in a plan view, provided is a contact hole 10a penetrating the protection film 7 sandwiched between the common wire 11 and the connection portion 86. At the contact hole 10a, the common wire 11 and the connection portion 86 are connected to each other. Herein, shown is an exemplary case where the common wire 11 is covered with the film 61. In this case, at the contact hole 10a, the common wire 11 is connected to the connection portion 86 through the film 61.

In part of an area where the connection portion 86 and the wire 29 overlap each other at a position where no common wire 11 is provided in a plan view, provided is a contact hole 10b penetrating the protection film 7 and the gate insulating film 3 which are sandwiched between the connection portion 86 and the wire 29. At the contact hole 10b, the connection portion 86 and the wire 29 are connected to each other. The common wire 11 and the wire 29 are electrically connected to each other through the connection portion 86 thus, and a common potential is thereby applied to the wire 29 from the common wire 11.

Also on the side farther from the display area 50 and closer to the source-wire driving circuit 72, the short ring 13 connects the source wires 5 (or the source-wire leading lines continuous therewith) provided adjacently side by side at the semiconductor film 43.

As described above, a structure for connecting the gate-wire leading lines 14 at the short ring 13 can be achieved in the wire 53 and therebelow (on the side closer to the insulating substrate 1: see FIG. 3). Therefore, a shield electrode 90 which covers the structure with the protection film 7 interposed therebetween (in a layer upper than the structure) can be provided, extending from the connection portion 86. Considering that a common potential is supplied also to the shield electrode 90, this is preferable in terms of shielding the electric field generated from the gate-wire leading line 14.

In FIG. 5, the collectively-driving lighting testing circuit 12 is provided on the right side of the paper of the common wire 11 (in other words, on the side farther from the gate-wire driving circuit 71 than the common wire 11). The common wire 11 has the same structure as that shown in FIG. 4.

The collectively-driving lighting testing circuit 12 comprises a collectively-driving lighting inspection TFT driving gate wire 22, electrodes 55 and 56, the collectively-driving lighting testing circuit leading line 17, and a semiconductor film 42.

The semiconductor film 42, the part of the collectively-driving lighting inspection TFT driving gate wire 22 located just below the semiconductor film 42, and the electrodes 55 and 56 constitute a TFT 102 for collectively-driving lighting inspection.

The collectively-driving lighting inspection TFT driving gate wire 22 and the collectively-driving lighting testing circuit leading line 17 can be formed in the same process as that of the gate wire 2. The electrodes 55 and 56 are conductive films which can be formed in the same process as that of the source wire 5. The semiconductor film 42 can be formed in the same process as that of the semiconductor film 4 (also see FIG. 3).

Therefore, in a plan view, in an area where the gate wire 2 and the electrode 55 overlap each other (except the case where a contact hole is formed), the gate insulating film 3 exists between the gate wire 2 and the electrode 55. Further, in a plan view, in an area where the collectively-driving lighting testing circuit leading line 17 and the electrode 56 overlap each other (except the case where a contact hole is formed), the gate insulating film 3 exists between the collectively-driving lighting testing circuit leading line 17 and the electrode 56. Furthermore, the gate insulating film 3 exists between the semiconductor film 42 and the collectively-driving lighting inspection TFT driving gate wire 22, and in an area where the electrode 55 (or electrode 56) and the semiconductor film 42 overlap each other in a plan view, an ohmic contact film is provided between the electrode 55 and the semiconductor film 42.

The electrode 55 is connected to the gate wire 2 at a conversion portion 21b. The electrode 56 is connected to the collectively-driving lighting testing circuit leading line 17 at a conversion portion 21c.

More specifically, in a plan view, in part of an area where the gate wire 2 and the electrode 55 overlap each other, a contact hole 9b is provided. The contact hole 9b penetrates the gate insulating film 3 sandwiched by the gate wire 2 and the electrode 55. The conversion portion 21b includes the contact hole 9b.

In a plan view, in part of an area where the collectively-driving lighting testing circuit leading line 17 and the electrode 56 overlap each other, a contact hole 10c is provided. The contact hole 10c penetrates the gate insulating film 3 sandwiched by the collectively-driving lighting testing circuit leading line 17 and the electrode 56. Herein, shown is an exemplary case where the electrode 56 is covered with the film 61 in the vicinity of the contact hole 10c, and in this case, at the contact hole 10c, the electrode 56 is connected to an electrode 88 through the film 61.

In an area above the collectively-driving lighting testing circuit leading line 17 (on the frontward side of the paper of FIG. 5), where no electrode 56 is provided in the vicinity of the contact hole 10c, a contact hole 10d is provided. The contact hole 10d penetrates the protection film 7 and the gate insulating film 3.

The conversion portion 21c includes the contact holes 10c and 10d. The conversion portion 21c further includes the electrode 88 provided across the contact holes 10c and 10d. The electrode 88 can be formed in the same process as that of the connection portion 86 and the counter electrode 8. Therefore, the electrode 88 is connected to the collectively-driving lighting testing circuit leading line 17 at the contact hole 10c and connected to the electrode 56 at the contact hole 10d. In other words, the electrode 56 and the collectively-driving lighting testing circuit leading line 17 are electrically connected to each other through the electrode 88.

The size, the shape, the number, and the position of each of the contact holes 9a, 9b, and 10a to 10d can be arbitrarily designed.

The shield electrode 90 is provided, extending from the connection portion 86 toward the side opposite to the display area 50. The shield electrode 90 covers the common wire 11 and the conversion portion 21b with the protection film 7 interposed therebetween. This is preferable in terms of shielding the electric field generated from the gate wire 2.

Herein, shown is an exemplary case where the shield electrode 90 also covers the TFT 102. In order to prevent the short circuit between the collectively-driving lighting testing circuit leading line 17 and the common wire 11, however, the electrode 88 is separated from the shield electrode 90. The shield electrode 90 may not cover the TFT 102.

Further, when a product of liquid crystal display is used, in order to turn off the TFT 102, an off potential is inputted to the collectively-driving lighting inspection TFT driving gate wire 22.

Furthermore, since the conversion portion 21b is connected to the gate wire 2, the same potential is inputted to the conversion portion 21b as that of the gate wire 2 and the gate-wire leading line 14.

An advantage due to shielding of the electric field caused by the gate potential by using the shield electrode 90 which is formed in the same process as that of the counter electrode 8 and the connection portions 84 and 86 thus will be described, as compared with a comparative example.

Figure 7:
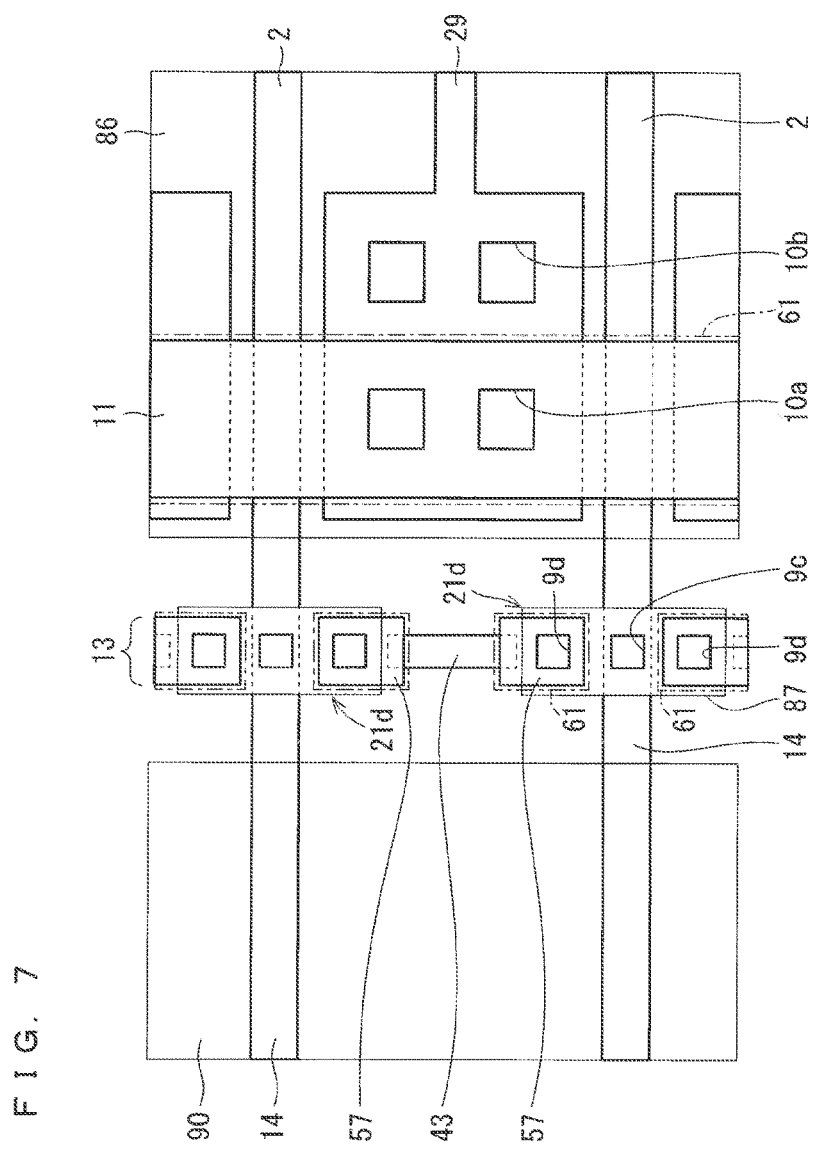
FIG. 7 is a plan view showing a structure of a comparative example corresponding to FIG. 4.
Figure 8:
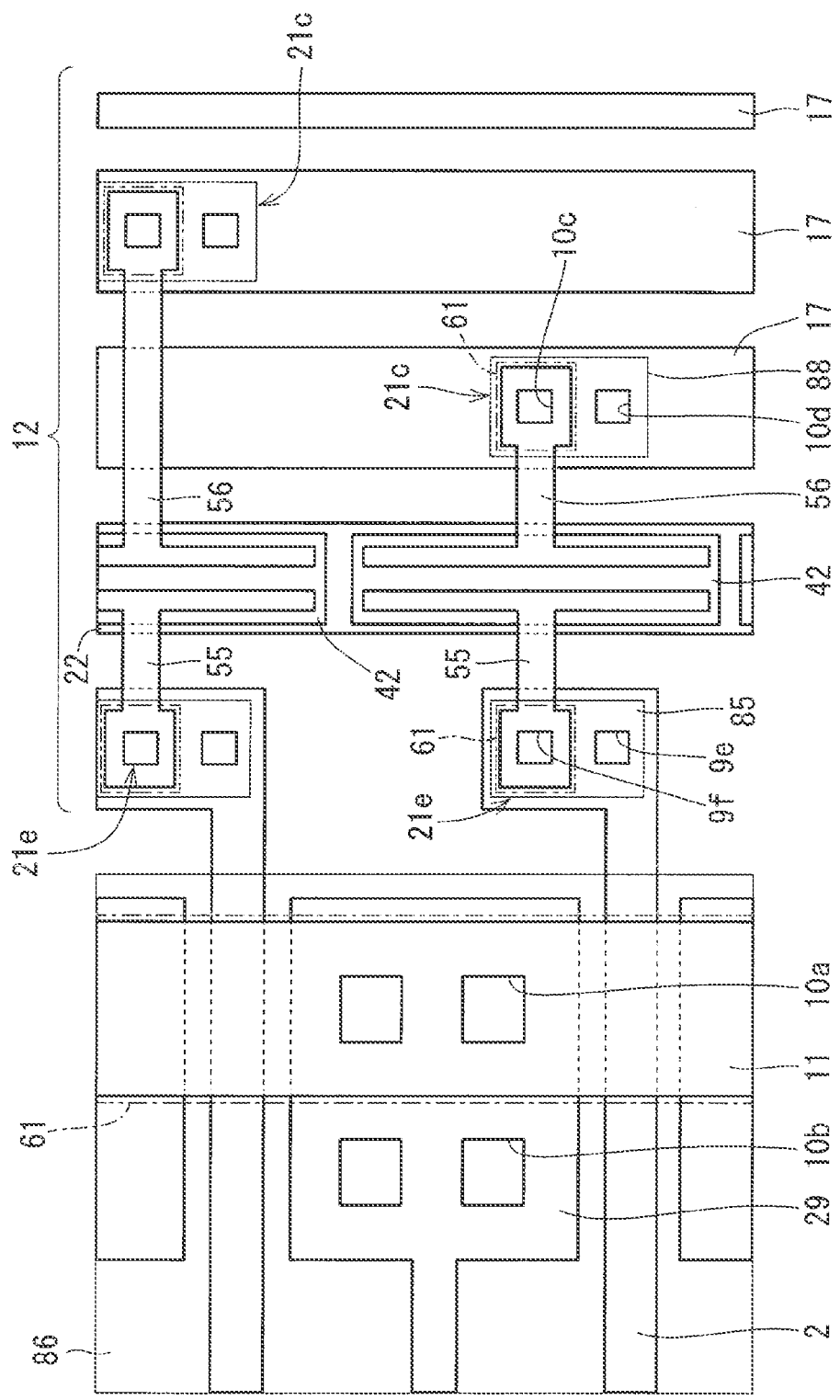
FIG. 8 is a plan view showing a structure of the comparative example corresponding to FIG. 5.

FIGS. 7 and 8 are plan views showing a structure of the comparative example. FIG. 7 shows an area corresponding to FIG. 4, and FIG. 8 shows an area corresponding to FIG. 5.

The structure shown in FIG. 7 is remarkably different from the structure shown in FIG. 4 in the structure of the short ring 13. The short ring 13 has a wire 57 and a semiconductor film 43. The wire 57 can be formed in the same process as that of the source wire 5. The short ring 13 is provided with a conversion portion 21d, and the conversion portion 21d comprises contact hole 9c and 9d and an electrode 87. The electrode 87 is formed in the same process as that of the shield electrode 90 and the connection portion 86.

The electrode 87 and the gate wire 2 (also can be grasped as the gate-wire leading line 14 in the vicinity of this area) overlap each other in an area in a plan view. In part of the area, the contact hole 9c is provided. The contact hole 9c penetrates the protection film 7 and the gate insulating film 3 like the contact hole 10b.

The electrode 87 and the wire 57 overlap each other in an area in a plan view. In part of the area, the contact hole 9d is provided. The contact hole 9d penetrates the protection film 7 like the contact hole 10a. Herein, shown is an exemplary case where the wire 57 is covered with the film 61, and in this case, at the contact hole 9d, the wire 57 is connected to the electrode 87 through the film 61.

Therefore, the electrode 87 is connected to the gate wire 2 (or the gate-wire leading line 14) at the contact hole 9c, and is connected to the wire 57 at the contact hole 9d. In other words, the wire 57 and the gate wire 2 (or the gate-wire leading line 14) are electrically connected to each other through the electrode 87.

The wire 57 and the semiconductor film 43 are connected to each other in the same manner as the wire 53 and the semiconductor film 43 are connected to each other.

In such a structure, though the shield electrode 90 covering the gate-wire leading line 14 (with the protection film 7 interposed therebetween) and the connection portion 86 can be formed in the same process, the shield electrode 90 and the connection portion 86 are separated from each other with the short ring 13. This is because the potential of the gate wire 2 is applied to the electrode 87 which is formed in the same process as that of the shield electrode 90 and the connection portion 86. In such a structure, in order to apply the common potential to the shield electrode 90 like the connection portion 86, it is necessary to electrically connect the shield electrode 90 and the connection portion 86 by providing a new layer in the thickness direction or providing a new area in a plan view. This connection disadvantageously invites increase in the process steps or increase in the size of the frame area.

Moreover, since the electrode 87 has the same potential as that of the gate wire 2, the electrode 87 cannot be covered with the shield electrode 90 and this increases the possibility that display unevenness will become obvious.

In the structure shown in FIG. 8, the collectively-driving lighting testing circuit 12 has a conversion portion 21e, and the conversion portion 21e is remarkably different from the conversion portion 21b shown in FIG. 5 in the structure.

The conversion portion 21e comprises contact holes 9e and 9f, and an electrode 85. The electrode 85 is formed in the same process as that of the shield electrode 90 and the connection portion 86.

The electrode 85 and the gate wire 2 overlap each other in an area in a plan view. In part of the area, the contact hole 9e is provided. The contact hole 9e penetrates the protection film 7 and the gate insulating film 3 like the contact hole 10b.

The electrode 85 and the electrode 55 overlap each other in an area in a plan view. In part of the area, the contact hole 9f is provided. The contact hole 9f penetrates the protection film 7 like the contact hole 10a. Herein, shown is an exemplary case where the electrode 55 is covered with the film 61 in the vicinity of the contact hole 9f, and in this case, at the contact hole 9f, the electrode 55 is connected to the electrode 85 through the film 61.

Therefore, the electrode 85 is connected to the gate wire 2 at the contact hole 9e, and is connected to the electrode 55 at the contact hole 9f. In other words, the electrode 55 and the gate wire 2 are electrically connected to each other through the electrode 85.

Like the electrode 87, the electrode 85 cannot be covered with the shield electrode 90. Therefore, the structure shown in FIG. 8 increases the possibility that display unevenness will become obvious.

As compared with such a structure of the comparative example, in the structure of the present embodiment, i.e., the structure shown in FIGS. 3 to 6, the gate wire 2, the gate-wire leading line 14, the conversion portions 21a and 21b are covered with the shield electrode 90, and the shield electrode 90 is supplied with the common potential. Therefore, it is possible to shield the electric field generated from the gate wire 2 and the gate-wire leading line 14 without widening the frame area and prevent display unevenness.

In the structure of the first embodiment, after the gate insulating film 3, the semiconductor films 4, 42, and 43, and the ohmic contact film 41 are layered, adopted is a process for forming an opening in the gate insulating film 3 by using a photomask used for forming the contact holes 9a and 9b. After that, the source wire 5, the wire 53, and the electrodes 55 and 56 are formed. The film which is formed in the same process as that of the connection portion 86 and the shield electrode 90 is not thereby needed to connect the gate wire 2 and the gate-wire leading line 14 to another wire.

Therefore, as described above, with the shield electrode 90, it is possible to shield the electric field generated from the gate wire 2 without widening the frame area. The above can be generally described as follows: The liquid crystal display shown in the first embodiment is a display device having the liquid crystal display panel 60. The liquid crystal display panel 60 includes the array substrate 70 and the counter substrate 80 facing the array substrate 70. The array substrate 70 has a plurality of TFTs 101, and each of the TFTs 101 is provided corresponding to the intersection between the gate wire 2 and the source wire 5. The array substrate 70 also has the pixel electrode 6 connected to the TFT 101, and the counter electrode 8 facing the pixel electrode 6.

The frame area 54 on the outer side of the display area 50 on the array substrate 70 is provided with the gate-wire leading line 14 connected to the gate wire 2.

The array substrate 70 has the conversion portion 21a provided in the vicinity of the display area 50. At the conversion portion 21a, the gate-wire leading line 14 is connected to the wire 53. The gate-wire leading line 14 is formed in the same process as that of the gate wire 2 and the wire 53 is formed in the same process as that of the source wire 5, and the gate insulating film 3 exists between the gate-wire leading line 14 and the wire 53. Therefore, it is grasped that the wire 53 is another wiring layer which is different from the gate-wire leading line 14. The wire 53 and the gate-wire leading line 14 are in direct contact with and electrically connected to each other through the contact hole 9a provided by opening the gate insulating film 3.

Alternatively, the array substrate 70 has the conversion portion 21b provided in the vicinity of the display area 50. At the conversion portion 21b, the gate wire 2 is connected to the electrode 55. The electrode 55 is formed in the same process as that of the source wire 5, and the gate insulating film 3 exists between the gate wire 2 and the electrode 55. Therefore, it is grasped that the electrode 55 is another wiring layer which is different from the gate wire 2. The electrode 55 and the gate wire 2 are in direct contact with and electrically connected to each other through the contact hole 9b provided by opening the gate insulating film 3.

The array substrate 70 has the protection film 7 provided above the conversion portions 21a and 21b, serving as an insulating film, and the shield electrode 90 provided to face the conversion portions 21a and 21b with the protection film 7 interposed therebetween, serving as a conductive layer having light transmittance.

The shield electrode 90 is continuous with the connection portion 86, and the common potential is applied to the connection portion 86 together with the counter electrode 8.

By adopting the above-described structure, in the display device using the transverse electric field type liquid crystal display technology, it is possible to suppress display unevenness and also suppress decrease in display quality without widening the frame area.

Further, the structure of the conversion portions 21a and 21b is not necessarily an essential requirement for suppressing display unevenness without widening the frame area. By adopting the structure, however, the conversion portions 21a and 21b can be obtained on the side closer to the insulating substrate 1 than the protection film 7. Therefore, the present embodiment produces an advantage that the shield electrode 90 is provided upper than the protection film 7 and the shield electrode 90 can be formed in the same process as that of the counter electrode 8.

The wire 29 can be grasped as a connecting line to be connected to the counter electrode 8. Then, the counter electrode 8 is connected to the common wire 11 and the wire 29 through the contact holes 10a and 10b, respectively. The connection portion 86 is different from the common wire 11.

Since the wire 29 is connected to the common wire 11, the common potential is applied to a plurality of wires 29 from the common wire 11. It is thereby possible to reduce the resistance between a plurality of counter electrodes 8 and reduce the difference of the common potentials.

Further, it can be grasped that the constituent elements which are formed in the same process have the same material and the same layered order on the array substrate 70. For example, the gate-wire leading line 14 and the collectively-driving lighting testing circuit leading line 17 can be formed in the same process as that of the gate wire 2. The gate-wire leading line 14 and the collectively-driving lighting testing circuit leading line 17 have the same material as that of the gate wire 2 and are formed on the insulating substrate 1 with no element interposed therebetween. Furthermore, the wire 53, the electrodes 55 and 56, and the source wire 5 have the same material and are formed on the gate insulating film 3 without no element interposed therebetween, except at a portion in the contact hole.

The collectively-driving lighting testing circuit leading line 17, however, is provided as a wire different from the gate wire 2 and the gate-wire leading line 14. The electrode 56 is also provided as a wire different from the wire 53, the electrode 55, and the source wire 5. Then, at the conversion portion 21c, the electrode 88 connects the collectively-driving lighting testing circuit leading line 17 and the electrode 56 through the contact holes 10c and 10d opened in the protection film 7 (or further in the gate insulating film 3).

A structure similar to the conversion portion 21c is shown in Patent Document 2, and it is known that the technique has an advantage of reduction in the process steps.

The shield electrode 90 is formed in a process different from that of the gate wire 2 or the source wire 5 and has a different layered order on the array substrate 70. In other words, the shield electrode 90 can be formed above the gate wire 2 and the source wire 5 with protection film 7 interposed therebetween. More specifically, the shield electrode 90 is arranged in the top layer on the array substrate 70 (farthest from the insulating substrate 1 among the other constituent elements), like the counter electrode 8. The shield electrode 90 can be formed in the same process as that of the counter electrode 8, and no different process is needed to form the shield electrode 90.

<The Second Embodiment>

In the second embodiment of the present invention, a preferred method of forming the wire 53 and the electrode 55, and the source electrode 51 and the drain electrode 52 in the same process will be described. More specifically, a photomask used for forming the contact hole 9a or 9b is made common to a photomask used for forming the semiconductor film 4.

The structure obtained by the manufacturing method described in the second embodiment is the same as that shown in the first embodiment, and therefore the second embodiment produces the same effect as that of the first embodiment, for increasing display quality without widening the frame area.

FIGS. 9 to 16 are cross sections used for explanation of a flow of manufacturing process of a display device in accordance with the second embodiment. In these figures, on the left side of the break line, shown is a cross section of an area where the TFT 101 (see FIGS. 1 and 3) is to be formed, and on the right side of the break line, shown is a cross section of an area where the conversion portion 21a or 21b (see FIGS. 4 to 6) is to be formed.

Figure 9:
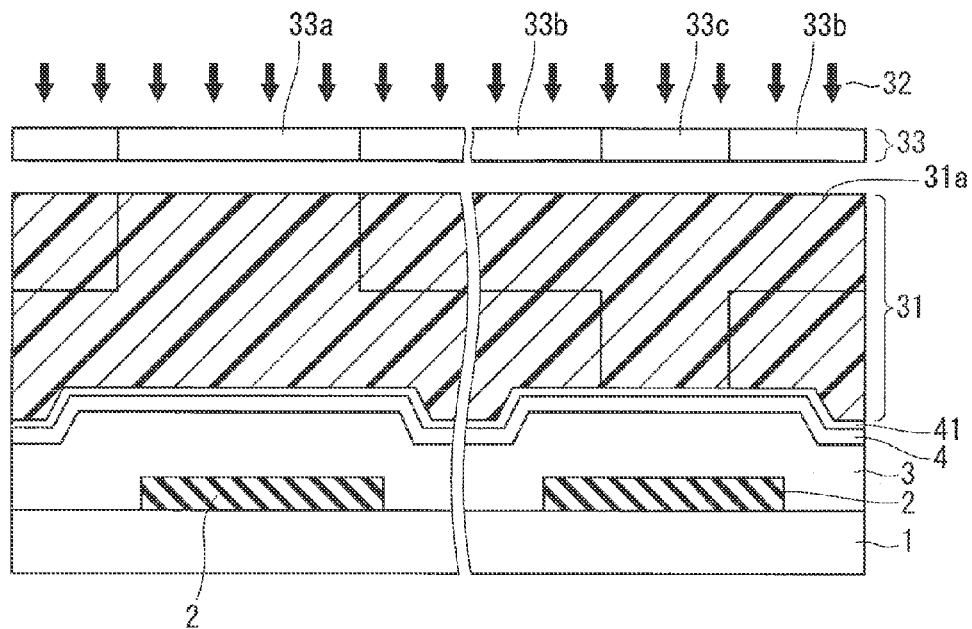

FIG. 9 shows an exposure process to be performed after the gate wire 2, the gate insulating film 3, the semiconductor film 4, the ohmic contact film 41, and a photoresist 31 are formed on the insulating substrate 1 in this order. An exposure 32 is performed on the photoresist 31 through a well-known halftone mask 33, to thereby achieve an exposure with three-level different intensities depending on the area.

The halftone mask 33 includes a first light transmissive area 33a, a second light transmissive area 33b, and a third light transmissive area 33c. The second light transmissive area 33b has intermediate optical transparency between those of the first light transmissive area 33a and the third light transmissive area 33c.

Herein, as the first light transmissive area 33a, adopted is a light shielding area through which no light passes. The first light transmissive area 33a, however, may be at least an area having optical transparency lower than that of the second light transmissive area 33b and may be a halftone exposure area slightly having optical transparency.

As the third light transmissive area 33c, adopted is an opening area which hardly shields light. The third light transmissive area 33c, however, may be at least an area having optical transparency higher than that of the second light transmissive area 33b and may be a halftone exposure area slightly shielding light.

A specific structure may be formed of a film having a predetermined uniform optical transparency. Alternatively, actual optical transparency may be reduced by forming a light shielding film on a fine pattern below the exposure resolution limit.

By performing the exposure 32 through the halftone mask 33, an exposure is performed on the photoresist 31 with three-level different intensities, i.e., the three-level different quantities of light depending on the area. Since the depth of exposure or the level of exposure in the photoresist 31 is different in accordance with the exposure intensity or the quantity of light exposure, by exposing with the three-level different intensities or the three-level different quantities of light, an exposure area 31a of different depth of exposure or different level of exposure is formed in each area.

In the second embodiment, a positive-type photoresist is used. Therefore, in accordance with the exposure intensity or the quantity of light exposure, in an area with high exposure intensity or the large quantity of light exposure, the exposure area 31a is indicated thicker.

Herein, in an area corresponding to the first light transmissive area 33a, no exposure area 31a is formed. In an area corresponding to the second light transmissive area 33b, an exposure area 31a is formed in part of the photoresist 31 in a film thickness direction. In an area corresponding to the third light transmissive area 33c, an exposure area 31 a is formed entirely in the photoresist 31 in the film thickness direction.

Since the first light transmissive area 33a may have optical transparency, also in the area corresponding to the first light transmissive area 33a, an exposure area 31a may be formed thinner than the exposure area 31a formed in the area corresponding to the second light transmissive area 33b.

Though the exposure area 31a is shown with the thickness thereof varied in FIG. 9, the level of photosensitivity in the photoresist 31 is changed in accordance with the exposure intensity or the quantity of light exposure but the depth of the exposure area 31a which is an exposed area is not necessarily changed.

In other words, the thickness of the exposure area 31a shown in FIG. 9 is a rough indication of the exposure level. Therefore, it is grasped that the exposed depth is not necessarily shown but the exposure level is shown.

In a development process under a predetermined condition which will be performed later, however, in accordance with the depth of the exposure area 31a or the exposure level of the exposure area 31a, as the exposure intensity is higher or the quantity of light exposure is larger, the thickness of the exposure area 31a to be removed consequently becomes larger. In other words, as the exposure intensity is higher or the quantity of light exposure is larger, the film thickness of the photoresist to be left after the development becomes thinner.

The first light transmissive area 33a corresponds to an area where a pattern is formed in the semiconductor film 4, such as a channel portion of the TFT 101. The third light transmissive area 33c corresponds to an area where the contact hole 9a or 9b opened in the gate insulating film 3 at the conversion portion 21a or 21b is formed, respectively. The second light transmissive area 33b corresponds to an area where the gate insulating film 3 is left.

Figure 10:
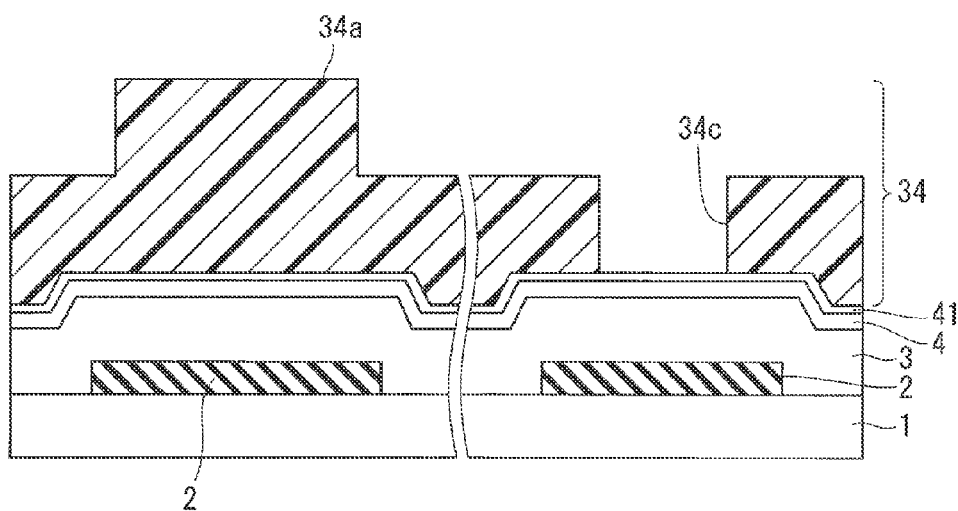

After the process step shown in FIG. 9 is performed, the development process is performed on the photoresist 31, to thereby remove the exposure area 31a. As a result, as shown in FIG. 10, formed is a photoresist 34 having a convex portion 34a and an opening 34c. The convex portion 34a can be also grasped as a thick film portion 34a having a large thickness.

The thick film portion 34a is positioned in an area where the semiconductor film 4 to be used in the TFT 101 is patterned. The opening 34c is positioned in an area where the contact hole 9a or 9b is formed. The photoresist 34 serves as an etching mask used for etching described later.

Figure 11:
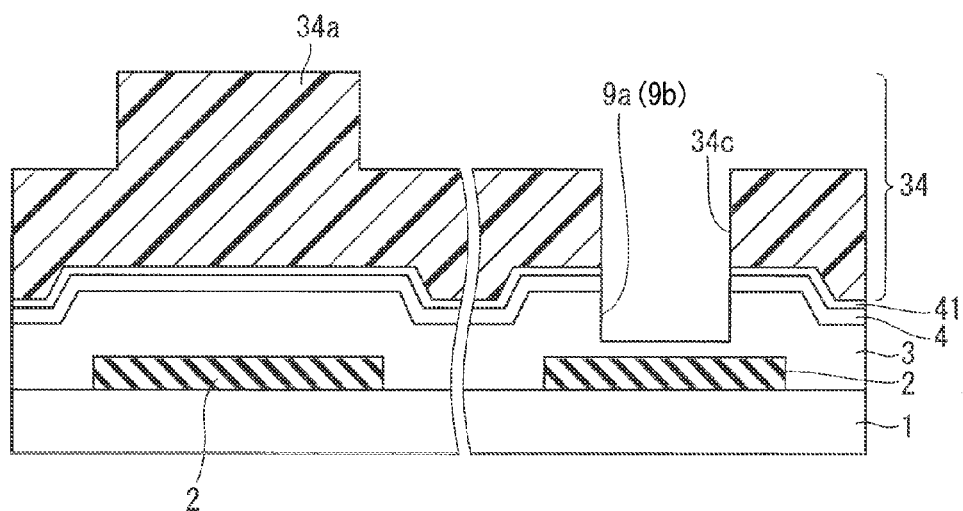

Subsequently, a dry etching process is performed through the photoresist 34. Through this process, removed are the ohmic contact film 41 and the semiconductor film 4 that are exposed in the opening 34c. Further, the thickness of the gate insulating film 3 is reduced, with at least an upper portion thereof (farther portion from the insulating substrate 1) removed. The film thickness of the gate insulating film 3 in the opening 34c thereby becomes thinner than that of the gate insulating film 3 in other areas. A structure shown in FIG. 11 is obtained thus.

Alternatively, by removing all the gate insulating film 3 in the opening 34c, the gate wire 2 may be exposed in the contact hole 9a or 9b. In FIGS. 11 to 16, the reference sign for the conversion portion 21a is adopted, and then the reference sign for the conversion portion 21b is added. In FIG. 11, for example, the contact hole 9a or 9b is represented as "9a (9b)".

Figure 12:
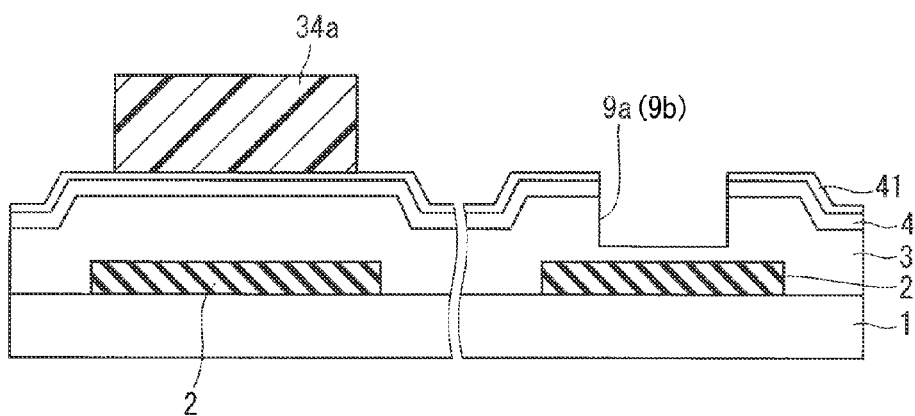

Subsequently, by executing an ashing process using a plasma treatment with oxygen gas, a thickness reduction process is performed to cut the photoresist 34. With this thickness reduction process, the photoresist 34 is removed so that only the area where the thick film portion 34a is formed is left. The thick film portion 34a is left, correspondingly to the area where the semiconductor film 4 to be used in the TFT 101 is to be formed. Through the above process, a structure shown in FIG. 12 is obtained.

Further, the ashing time may be determined in advance. In this case, by evaluating the film thickness of the thick film portion 34a and those of portions other than the thick film portion 34a, the ashing time may be set as appropriate between a time period required to remove all the film thicknesses of the portions other than the thick film portion 34a and a time period required to etch the film thickness in the thick film portion 34a.

Furthermore, when the photoresist 34 on a surface of the ohmic contact film 41 is removed and the ohmic contact film 41 is exposed by plasma of the ashing, a luminous phenomenon can be observed. By monitoring the luminous phenomenon, the timing for stopping the ashing may be determined.

Figure 13:
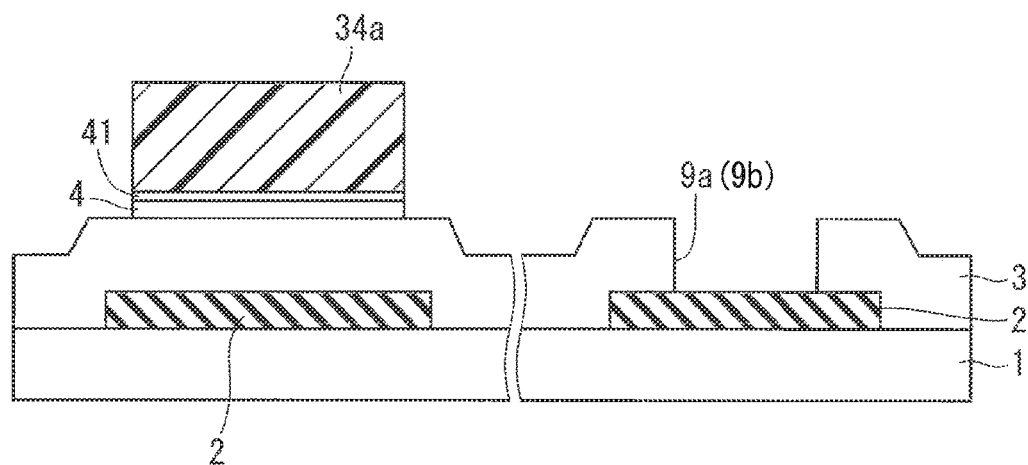

Subsequently, by using the left thick film portion 34a as a mask, the semiconductor film 4, the ohmic contact film 41, and the gate insulating film 3 in the contact hole 9a or 9b (in the area not covered with the left thick film portion 34a) are removed by dry etching. With this dry etching, the semiconductor film 4 and the ohmic contact film 41 are patterned into shapes to be used in the TFT 101, and the contact hole 9a or 9b penetrates the gate insulating film 3, to thereby expose the gate wire 2. Through this process, a structure shown in FIG. 13 is obtained. As mentioned above, the gate insulating film 3 in the contact hole 9a or 9b may be removed prior to the dry etching process.

Thus, by using the halftone mask 33 and adding the process for ashing the photoresist 31, it is possible to share the photomask for forming the contact hole 9a or 9b and for patterning the semiconductor film 4 and the ohmic contact film 41 to be used in the TFT 101, to thereby obtain the photoresist 34. In other words, the photomask (herein, the halftone mask 33) used in one photolithography process is also used as the etching mask. This makes it possible to share the process steps of exposure, development, and removal of the photoresist and contributes to reduction in the process time.

Figure 14:
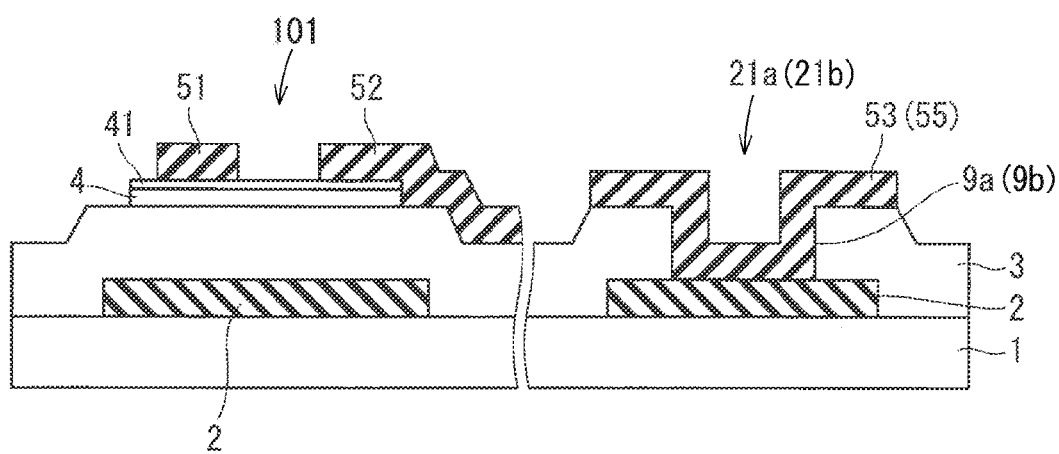

After that, the thick film portion 34a is removed. Then, a conductive layer which is to be a material for the wire 53 and the electrode 55 and for the source electrode 51 and the drain electrode 52 is formed. Process steps of coating a photoresist to the conductive layer, exposing by using the photomask for patterning, developing, and wet-etching the conductive layer, and removing the photoresist are performed. Through the process steps, the wire 53 and the electrode 55 which are provided on the gate wire 2 and the source electrode 51 and the drain electrode 52 which are provided on the semiconductor film 4 with the ohmic contact film 41 interposed therebetween are formed, to thereby obtain a structure shown in FIG. 14. In the structure of FIG. 14, the TFT 101 is achieved.

After that, a transparent conductive film which is to be a material for the pixel electrode 6 is formed, and process steps of coating a photoresist 35 to the transparent conductive film, exposing by using the photomask for pattern formation of the pixel electrode 6, developing, and wet-etching the transparent conductive film are performed. Through the process steps, the pixel electrode 6 is formed on part of the drain electrode 52, to thereby obtain a structure shown in FIG. 15.

Further, with the photoresist 35 left, the ohmic contact film 41 exposed from the source electrode 51 and the drain electrode 52 is removed by performing dry etching. Through this process, the channel portion of the TFT 101 is formed, to thereby obtain a structure shown in FIG. 16.

Thus, by using the technique of the second embodiment, in achieving the display device shown in the first embodiment, effects of cost reduction due to the sharing of photomask and time reduction of the array process is achieved.

<Variations>

The above description is limited to the case where the counter electrode 8 an the pixel electrode 6 are arranged in the pixel 30 as the upper electrode and the lower electrode, respectively. The first and second embodiments show contrivances for the structure of the collectively-driving lighting testing circuit 12 and that of the short ring 13. Therefore, the contrivances can be applied to a case where the counter electrode 8 and the pixel electrode 6 are arranged in the pixel 30 as the lower electrode and the upper electrode, respectively. In this case, the wire 29 is especially preferable for supplying the common potential to the counter electrode used as the lower electrode.

While the invention has been shown and described in detail, the foregoing description is in all aspects illustrative and not restrictive. It is therefore understood that numerous modifications and variations can be devised without departing from the scope of the invention.

What is claimed is:
1. A display device comprising:
an array substrate; and
a counter substrate facing said array substrate,
wherein said array substrate has a plurality of thin film transistors provided corresponding to intersections between a plurality of gate wires and a plurality of source wires, respectively;

pixel electrodes connected to said thin film transistors;

counter electrodes facing said pixel electrodes;

a leading line provided outside a display area, being connected to one of said gate wires;

a conversion portion provided in the vicinity and outside of said display area, by which said leading line is connected to another wiring layer;

an insulating film provided on said conversion portion at a side of said counter substrate; and a conductive layer provided on said insulating film on an array substrate side of the display device, the conductive layer having transparency, to which a common potential is applied together with said counter electrodes.

2. The display device according to claim 1, wherein said leading line and said another wiring layer are in direct contact with and electrically connected to each other through a contact hole which is provided at said conversion portion by opening said insulating film.

3. The display device according to claim 1, wherein said array substrate further has connecting lines connected to said counter electrodes; and a common wire connecting one of said connecting lines and another one of said connecting lines, which is different from said conductive layer.

4. The display device according to claim 1, further having:

a first wire different from said leading line and said gate wires, having the same material and the same layered order on said array substrate as those of said leading line and said gate wires;

a second wire different from said source wires, having the same material and the same layered order on said array substrate as those of said source wires; and an electrode connecting said first wire and said second wire through a contact hole opened in said insulating film.

5. The display device according to claim 1, wherein said conductive layer is different from said gate wires and said source wires in the layered order on said array substrate.

6. The display device according to claim 1, wherein said conductive layer is provided in a top layer on said array substrate and has the same material and the same layered order on said array substrate as those of said counter electrodes or said pixel electrodes.

7. The display device according to claim 1, wherein said leading line extends towards an output of a gate-wire-driving circuit, and said leading line is connected to said gate-wire-driving circuit.

8. The display device according to claim 2, further having:

a first wire different from said leading line and said gate wires, having the same material and the same layered order on said array substrate as those of said leading line and said gate wires;

a second wire different from said source wires, having the same material and the same layered order on said array substrate as those of said source wires; and an electrode connecting said first wire and said second wire through a contact hole opened in said insulating film.

9. The display device according to claim 3, further having:

a first wire different from said leading line and said gate wires, having the same material and the same layered order on said array substrate as those of said leading line and said gate wire;

a second wire different from said source wires, having the same material and the same layered order on said array substrate as those of said source wires; and an electrode connecting said first wire and said second wire through a contact hole opened in said insulating film.

10. A method of manufacturing a thin film transistor for forming an electrode and a conductive film on a structure having a gate wire, a gate insulating film provided on said gate wire, and a semiconductor film provided on said gate insulating film, said electrode forming a thin film transistor together with said structure, said conductive film being connected to said gate wire, comprising a step of:

using an etching mask for forming said semiconductor film to be used to obtain said thin film transistor and for selectively removing said gate insulating film and said semiconductor film in an area to be used to connect said conductive film to said gate wire, said etching mask being obtained by using a photomask used in one photolithography process, wherein, prior to said selectively removing, said semiconductor film overlaps a portion of said gate wire that, after said selectively removing, is connected to said conductive film.

11. The method of manufacturing a thin film transistor according to claim 10, wherein said etching mask has a convex portion and an opening, said method comprising the steps of:

(a) removing said semiconductor film and reducing the thickness of said gate insulating film, removing and reducing in said opening;

(b) reducing the thickness of said etching mask to thereby leave said etching mask only in an area where said convex portion is provided, after said step (a);

(c) removing said semiconductor film not covered with said etching mask which remains after said step (b);

(d) removing said gate insulating film at a position where the thickness of said gate insulating film is reduced; and (e) forming said electrode on said semiconductor film and forming said conductive film on said gate wire, after said step (c).

* * * * *